(12) United States Patent
Wang (10) Patent No.: US 12,300,324 B2
(45) Date of Patent: May 13, 2025

(54) SUPER SHORT CHANNEL NOR FLASH CELL ARRAY AND PROGRAMMING METHOD THEREOF

(71) Applicant: FS-SEMI Semiconductor Corporation., Ltd., Hsinchu County (TW)

(72) Inventor: Lee Wang, Hsinchu County (TW)

(73) Assignee: FS-SEMI SEMICONDUCTOR CORPORATION, LTD., Hsinchu County (TW)

( * ) Notice: Subject to any disclaimer, the term of this patent is extended or adjusted under 35 U.S.C. 154(b) by 208 days.

(21) Appl. No.: 18/109,663

(22) Filed: Feb. 14, 2023

(65) Prior Publication Data

US 2024/0135997 A1    Apr. 25, 2024
US 2024/0233829 A9    Jul. 11, 2024

(30) Foreign Application Priority Data

Oct. 24, 2022 (CN) .......................... 202211304155.5

(51) Int. Cl.
*G11C 16/12* (2006.01)
*G11C 16/04* (2006.01)
(Continued)

(52) U.S. Cl.
CPC .......... *G11C 16/12* (2013.01); *G11C 16/0433* (2013.01); *G11C 16/08* (2013.01); *G11C 16/24* (2013.01)

(58) Field of Classification Search
CPC ..... G11C 16/12; G11C 16/0433; G11C 16/08; G11C 16/24
(Continued)

(56) References Cited

U.S. PATENT DOCUMENTS 6,301,158 B1 * 10/2001 Iwahashi ................ G11C 16/08
                                                                                       365/185.23
7,495,958 B2 * 2/2009 Chih .................. G11C 16/0433
                                                                                       365/185.13

(Continued)

FOREIGN PATENT DOCUMENTS

TW          201214630 A      4/2012
TW          201814703 A      4/2018

*Primary Examiner* — Huan Hoang
*Assistant Examiner* — Daniel J King
(74) *Attorney, Agent, or Firm* — Muncy, Geissler, Olds & Lowe, P.C.

(57) ABSTRACT

A Super Short Channel NOR-type (SSC NOR) flash array is disclosed. Upon the new Channel Induced Ternary Electron programming scheme for resolving the punch-through issue caused by the gate short channel of NVM cell devices, the gate length of NVM cell devices can be further shrunk below 100 nm for NOR flash array. The cell device of SSC NOR flash can be then scaled down to achieve the minimum cell sizes between $4F^2$ to $5F^2$, where F is the minimum feature size of a process technology node below 100 nm. In comparison with conventional NOR flash, the SSC NOR flash improves memory density resulting in cost reduction per bit storage. While on the benefit of increasing memory density and storage cost reduction, the invention preserves the typical NOR-type flash advantages over NAND flash on fast nanosecond-range access time, low operating voltages, and high reliability.

13 Claims, 11 Drawing Sheets

(51) Int. Cl.
*G11C 16/08* (2006.01)
*G11C 16/24* (2006.01)

(58) Field of Classification Search
USPC .................................................. 365/189.011
See application file for complete search history.

(56) References Cited

U.S. PATENT DOCUMENTS

| | | |
|---|---|---|
| 9,082,490 B2 | 7/2015 | Wang |
| 9,685,239 B1 * | 6/2017 | Wang ................. G11C 16/3427 |
| 9,698,149 B2 | 7/2017 | Purayath et al. |
| 10,607,703 B2 * | 3/2020 | Liang ................. G11C 16/0425 |

* cited by examiner

Fig. 3c aa' cutline cross section view

SUPER SHORT CHANNEL NOR FLASH CELL ARRAY AND PROGRAMMING METHOD THEREOF

BACKGROUND OF THE INVENTION

Field of the Invention

This invention relates to NOR-type flash memory cell array and programming method thereof. In particular, the gate lengths of the NOR flash memory cell can be scaled down to the minimum feature size provided by the capabilities of process technology nodes below 100 nm. For examples, the minimum feature size of a 20 nm process technology node can process the gate length of NOR flash memory cell down to the minimum feature size of 20 nm. The flash cell of the invention enables the gate length of the NOR flash memory cells to scale down below 100 nm for higher memory density leading to lower storage cost/per bit. While on the benefit of increasing the memory density, the disclosed invention preserves the typical NOR-type flash memory advantages over NAND-type flash memory on the fast nanosecond access time, low operating voltages, and higher reliability.

Description of the Related Art

Semiconductor Non-Volatile Memory (NVM), and particularly Electrically Erasable, Programmable Read-Only Memories (EEPROM), exhibit wide spread applicability in a range of electronic equipment from computers, to telecommunication hardware, to consumer appliances. In general, EEPROM serves a niche in the NVM space as a mechanism for storing firmware and data that can be kept even with power off and can be altered as needed.

Data is stored in an EEPROM cell by modulating its threshold voltage (device on/off voltage) of the Metal-Oxide-Semiconductor Field Effect Transistor (MOSFET) through the injection of charge carriers into the charge-storage layer from the substrate of the MOSFET. For example, with respect to an N-channel MOSFET, an accumulation of electrons in the floating gate, or in a dielectric layer, or in nano-crystals above the FET channel region, causes the MOSFET to exhibit a relatively high threshold voltage state.

Flash EEPROM may be regarded as a specifically configured EEPROM into cell array that may be erased only on a global or sector-by-sector basis. Flash NVM arrays are also categorized as NOR flash array and NAND flash array according to the configurations of the memory cell connections in the flash arrays. The conventional NOR flash array connects cell devices in parallel-connected pairs 10 in FIG. 1, where rows of common source electrodes of the paired cell devices 10 are connected to form multiple horizontal common source lines CS and columns of drain electrodes of the paired cell devices 10 are connected to form multiple vertical bitlines, respectively. As the cell device schematic for an "M×N" NOR flash array shown in FIG. 1, each wordline running in x-direction contains "M" NVM cells with the drain electrodes of the NOR cell pairs 10 vertically connected to form bitlines $B_i$ for i=1, ... M, and each bitline running in y-direction is attached with "N" drain electrodes of the NVM cells. The common source electrodes 11 of rows of NOR cell pairs 10 in the array are horizontally connected to form the common source lines CS. When a wordline is selected, the entire "M" NVM cells under the selected wordline are activated. On the other hand, the NVM cells under the unselected wordlines in the array are electrically detached from the "M" metal bitlines. The electrical responses at the drain electrodes of the selected "M" NVM cells can be detected through their attached "M" metal bitlines. Since the electrical biases and signals are directly applied through the metal bitlines and metal contacts to drain electrodes of the selected NVM cells in NOR-type flash array, the read access time is faster and programming operation voltages are lower for NOR-type flash in comparison with its counter part, NAND-type flash array.

Figure 1:
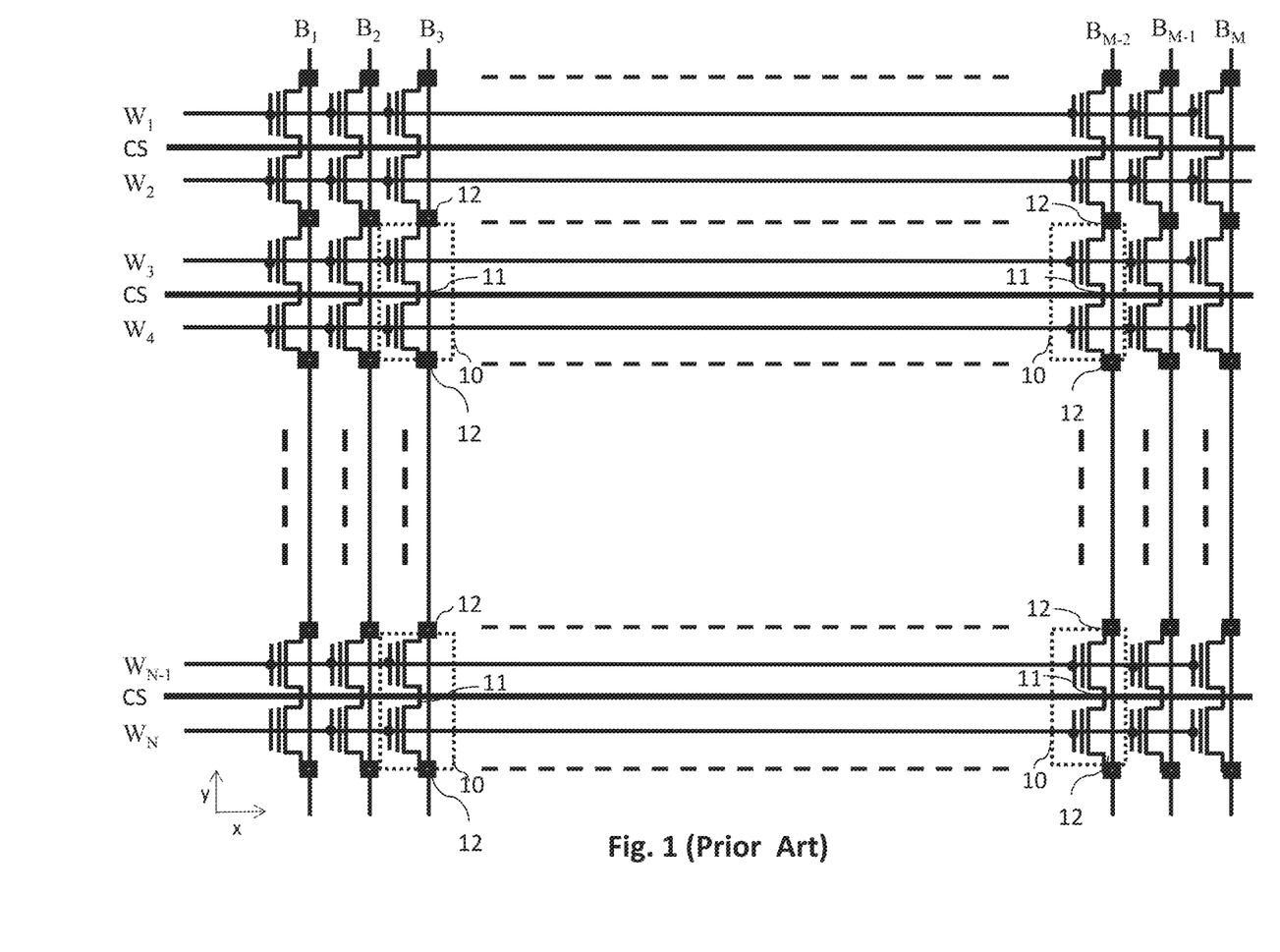
FIG. 1 shows a typical schematic for a NOR-type flash array.
Figure 2:
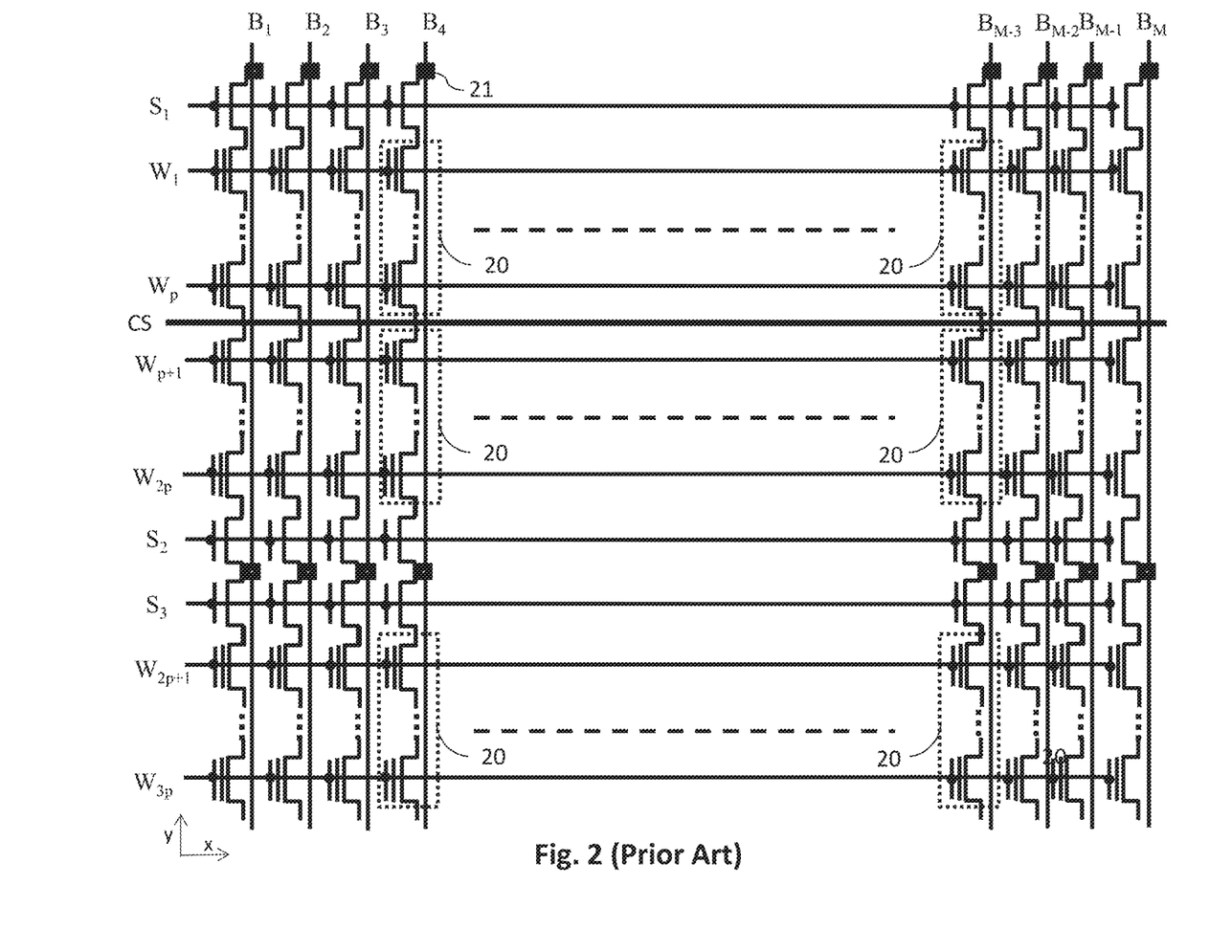
FIG. 2 shows a typical schematic for a NAND-type flash array.

The NAND-type flash array connects the NVM cells in series. Unlike the NOR-type array with the configuration of source electrode-to-source electrode connection and drain electrode-to-drain electrode connection, NAND-type array links the drain electrode of an NVM cell to the source electrode of its next neighboring cell. Usually, the numbers of NVM cells linked in one single NAND string 20 are from 8 cells to 512 cells depending on the generations of the process technology nodes. In FIG. 2 the schematic for an "M×N" NAND flash array, the array contains multiple NAND cell strings 20 and each NAND cell string 20 contains "p" NVM cells (p=8~512) and one selection gate to connect the string to the each main metal bitline $B_i$. Each main metal bitline has "q" NAND strings 20 attached. Thus the total NVM cells attached to a single main bitline is p*q=N for an "M×N" NAND array. Since the source electrode and the drain electrode of NVM cells are overlapped each others in the NAND cell string 20, the NVM cells have no contacts in between the linked NVM cells except one contact 21 placed at the end of the cell string for connecting the NAND strings 20 to the main metal bitline. Usually, a single main bitline connects several NAND strings 20 vertically and Common Source (CS) lines run horizontally in the NAND flash array. In contrast, each NVM cell in NOR-type array does have one contact 12 for connecting a single cell's drain electrode to the main bitline as shown in FIG. 1. A NOR-type flash array is equivalently to a NAND-type array with p=1. Typically, the cell sizes of the NOR-type NVM cells including the area for a single contact 12 in a NOR flash array are 9~10 $F^2$ and the cell sizes of the NAND-type NVM cells without a contact area in a NAND flash array are 4~5 $F^2$, respectively, where F is minimum feature size for a process technology node. Therefore, the chip cell array areas for NAND type flash arrays are smaller than the NOR type flash arrays (~40% to ~50% smaller) for the same memory density with the same process technology node. The smaller cell array areas for NAND flash array have the advantage over NOR flash array in term of manufacturing cost for the same bit storage capacity.

On the other hand, to access a NAND flash cell in a NAND string requires sufficient high voltage applied to the control gates of the unselected NVM cells in the string for passing the electrical biases to the source electrode and drain electrode of the selected NVM cell. The access time including the time required for charging the unselected control gates to a sufficient high voltage to turn on the NVM cells in the NAND string for passing electrical biases is very long, typically, several tens of microseconds compared with a typical NOR flash access time of several tens of nanoseconds. For random read access, NOR flash array is several hundreds to thousands times faster than NAND flash array. This shortness of slow random access speed for NAND flash array hinders the applications for program code storage, where nanosecond access time is required for executing program codes.

For the programming methods, NOR flash applies Hot Carrier Injection (HCI) scheme and NAND flash applies Fowler-Nordheim (F/N) tunneling scheme, respectively. The HCI scheme for NOR flash programming applies the 0 V source voltage, the drain voltages around 4V to 6V, and the gate voltage as the drain voltage for pulse duration between hundreds of nanoseconds to tens of microseconds. While the F/N tunneling scheme for NAND flash programming requires higher gate-to-substrate applied voltages, 16V to 24V, for a longer pulse duration of hundreds of microseconds to tens of milliseconds. Therefore, the programming pulse duration per pulse shot for a NOR flash cell device is several orders of magnitudes shorter than that for a NAND flash cell device. Although the programming pulse duration for HCI scheme is much shorter than that for F/N tunneling scheme, the programming current (about hundreds of microamperes per cell device) for the HCI scheme is much higher than the programming current (less than tens of nanoamperes per device) for F/N tunneling scheme. Therefore, with limiting current capacity for the on-chip high voltage charge pumping circuit, the F/N tunneling scheme can program more pluralities of memory cells at once than the HCI scheme.

While on the road of scaling down the process technology node according to the well-known Moore's law, NOR flash array hit the most difficult technical road block below the 100 nm process technology nodes due to the memory cell device punch-through issue caused by the high source-drain voltage potential difference for HCI programming scheme. It is known that when the gate length of a cell device is shorten to a smaller gate length, the device source-drain punch-through voltage drops accordingly. A typical memory device punch-through voltage for a gate length below 100 nm is less than 3V, which is lower than the applied source-drain voltage bias (4V~6V) for HCI scheme. The device punch-through issue prevents the memory device gate length to further shrink below 100 nm for the NOR flash memory fabrication process, although the minimum feature of process technology node has already been progressing to far below 20 nm process technology nodes in the present time.

To resolve the memory device gate length scaling issue below 100 nm for NOR flash array, a programming scheme for the short channel length NVM device has been disclosed in U.S. Pat. No. 9,082,490 B2 (the disclosure of which are incorporated herein by reference in its entirety). Due to the increasing numbers of the high-energy ternary electrons induced in the NVM device's channel, a programming scheme of the invention is called Channel induced Ternary Electron (ChiTel) programming scheme, hereinafter. The ChiTel programming scheme of the invention applies no voltage bias to source electrodes (i.e., floating the source electrodes) and a relative low drain voltage compared with the drain voltage in the conventional HCI programming scheme, and consumes only about ¹/₁₀ of the conventional HCI programming current. Since there is no external electrical field generated between the applied drain voltage and the floating source electrodes, the punch-through issue of the programming cell devices would not occur for applying the ChiTel programming scheme. In this invention we design Super Short Channel (SSC) NOR flash memory cell with gate length scaled down to the minimum feature size of a process technology node below 100 nm and apply the ChiTel programming scheme for programming the newly designed SSC NOR flash cell array. The minimum achievable cell size for SSC NOR flash array for a given feature size of process technology node is also disclosed.

SUMMARY OF THE INVENTION

Figure 3A:
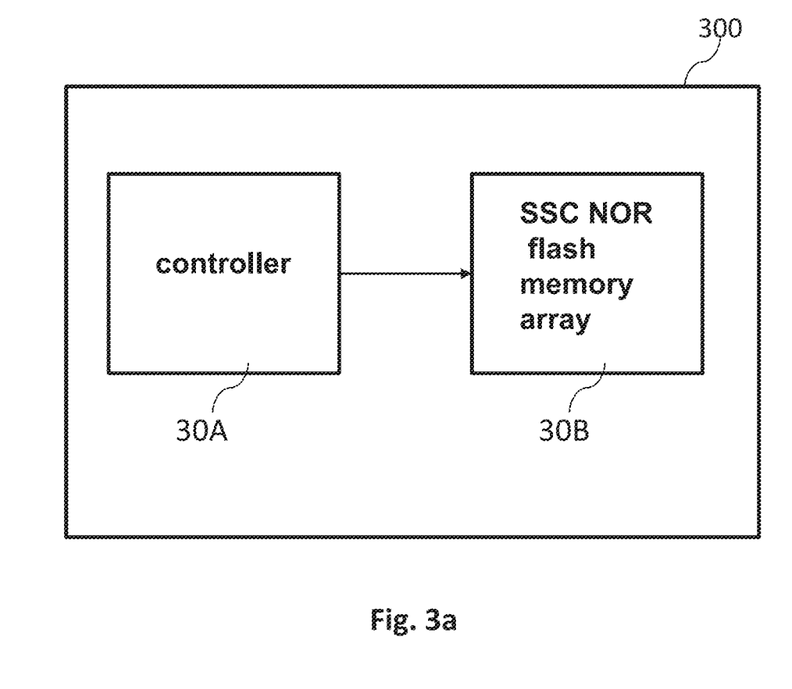
FIG. 3a shows a block diagram of a NOR flash memory device according to an embodiment of the invention.

FIG. 3a shows a block diagram of a NOR flash memory device according to an embodiment of the invention. Please be noted that FIG. 3a is simplified and people skilled in the art would appreciate that the NOR flash memory device 300 may further include other necessary elements. The NOR flash memory device 300 includes a controller 30A and a SSC NOR flash memory array 30B. The SSC NOR flash memory array 30B includes a plurality of memory cells organized in rows and columns. The controller 30A is coupled to the memory array 30B for controlling operations (for example but not limited to programming operations) over the SSC NOR flash memory array 30B.

Figure 3B:
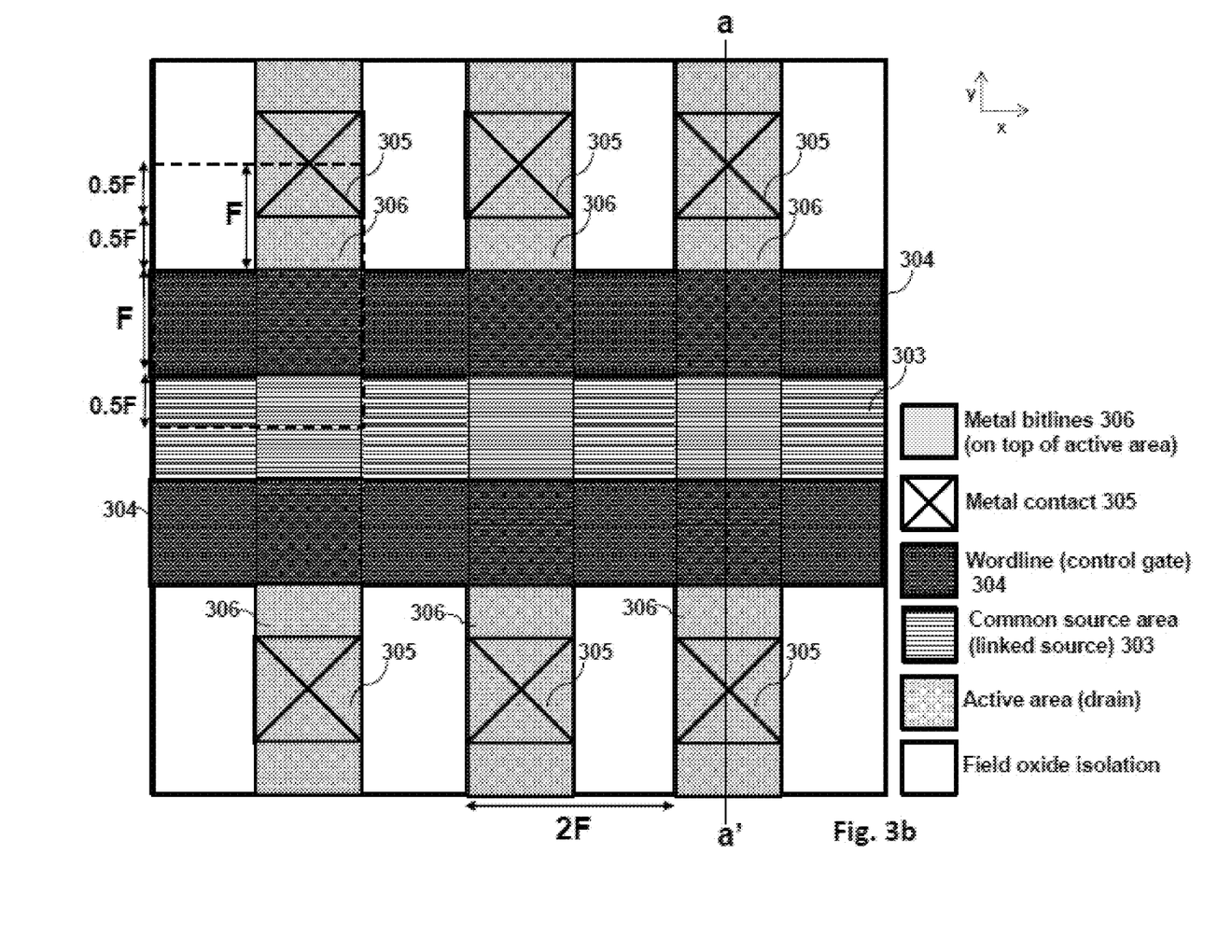
Figure 3C:
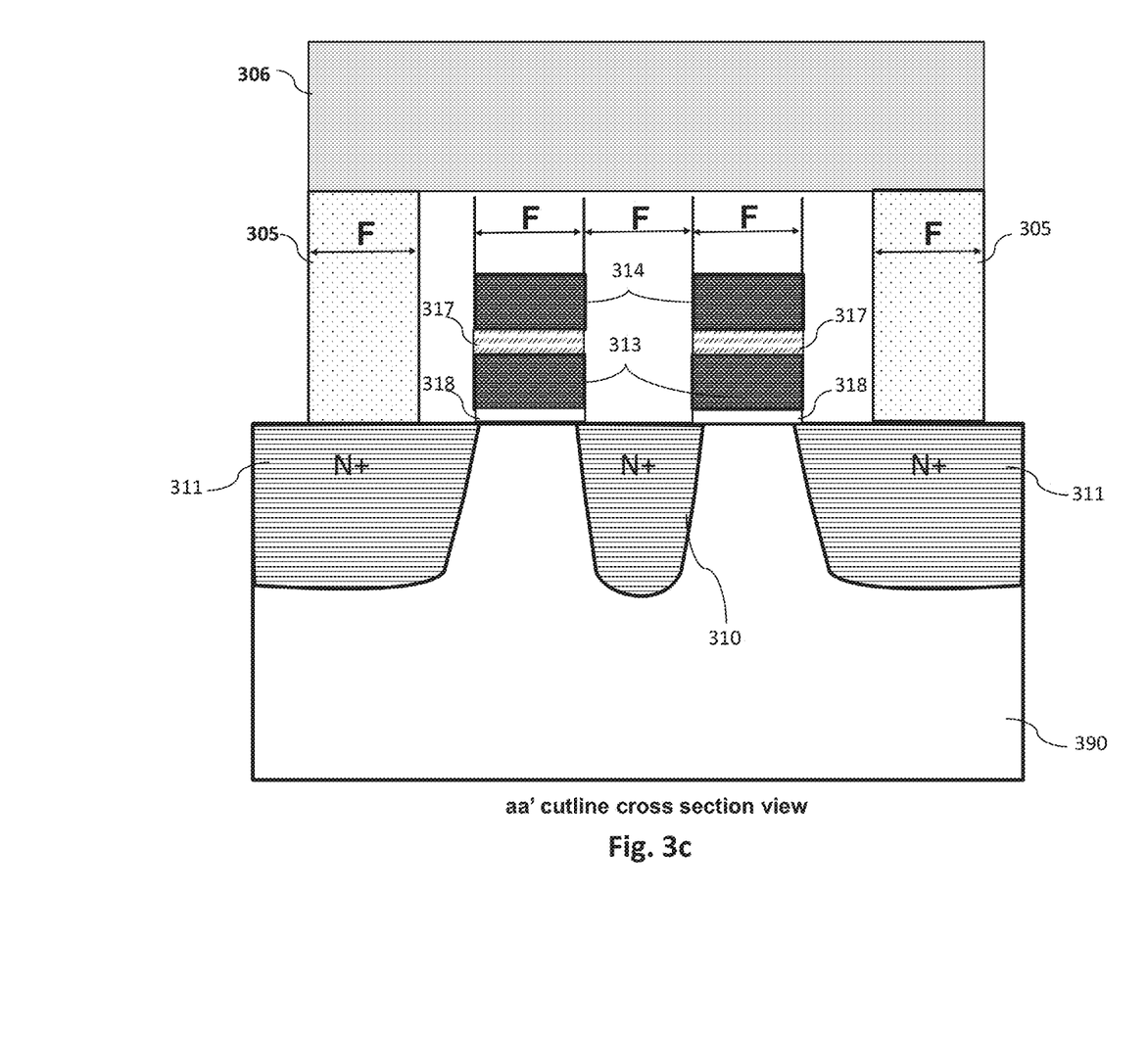
FIG. 3c shows the cross section view along the cut-line aa' in FIG. 3b.

According to the schematic of NOR flash array shown in FIG. 1, the width of every wordline, which is also the gate length of Non-Volatile Memory (NVM) cell devices, is designed to be the minimum feature size F of a process technology node below 100 nm. FIG. 3b shows the top view of a portion of the SSC NOR flash memory array 30B for a process technology node with a minimum feature size of F<100 nm. As we can see in FIG. 3b, the minimum pitch (i.e., the minimum width of the bitines and the minimum spacing/distance between column-adjacent cells) achievable in the x-direction provided by the process technology node is 2F. In the y-direction, the minimum width of the wordline (i.e., the minimum gate length of the NVM device), the minimum width of common source line, and the minimum size (contact: length=width) of contacts 305 achievable for the process technology node is F. The spacing/distance between wordlines 304 and contacts 305 is about F/2 more or less depending on capability of the process technology node to electrically isolate wordlines 304 from the bitline contacts 305, where the thickness of a dielectric film may be deposited in-between them for the electrical isolation. Therefore, the minimum cell size achievable for the process technology node with minimum feature size F<100 nm is the length (0.5+1+0.5+0.5)F in y-axis multiplied by the width 2F in x-axis=5 F². FIG. 3c is the cross section view of the cut-line aa' in FIG. 3b. According to the floating-gate non-volatile memory fabrication process, the cross-section view of the cut-line aa' in FIG. 3b is shown in FIG. 3c. In FIG. 3c, the n-type common source 310 and drains 311 are inside the P-type silicon substrate 390. The floating gate layer 313 for charge storage is deposited on top of the tunneling oxides 318 grown on the silicon substrate surface 390. A coupling dielectric 317 is deposited in-between the floating gates 313 (first poly-silicon layer) and control gates 314 (second poly-silicon layer) to form the capacitive coupling between control gates 314 and floating gates 313. The metal contacts 305 connect the drain electrodes 311 to the metal bitlines 306. Note that the dimension of device gate length is comprised with the minimum feature size F of a process technology node <100 nm.

Figure 4:
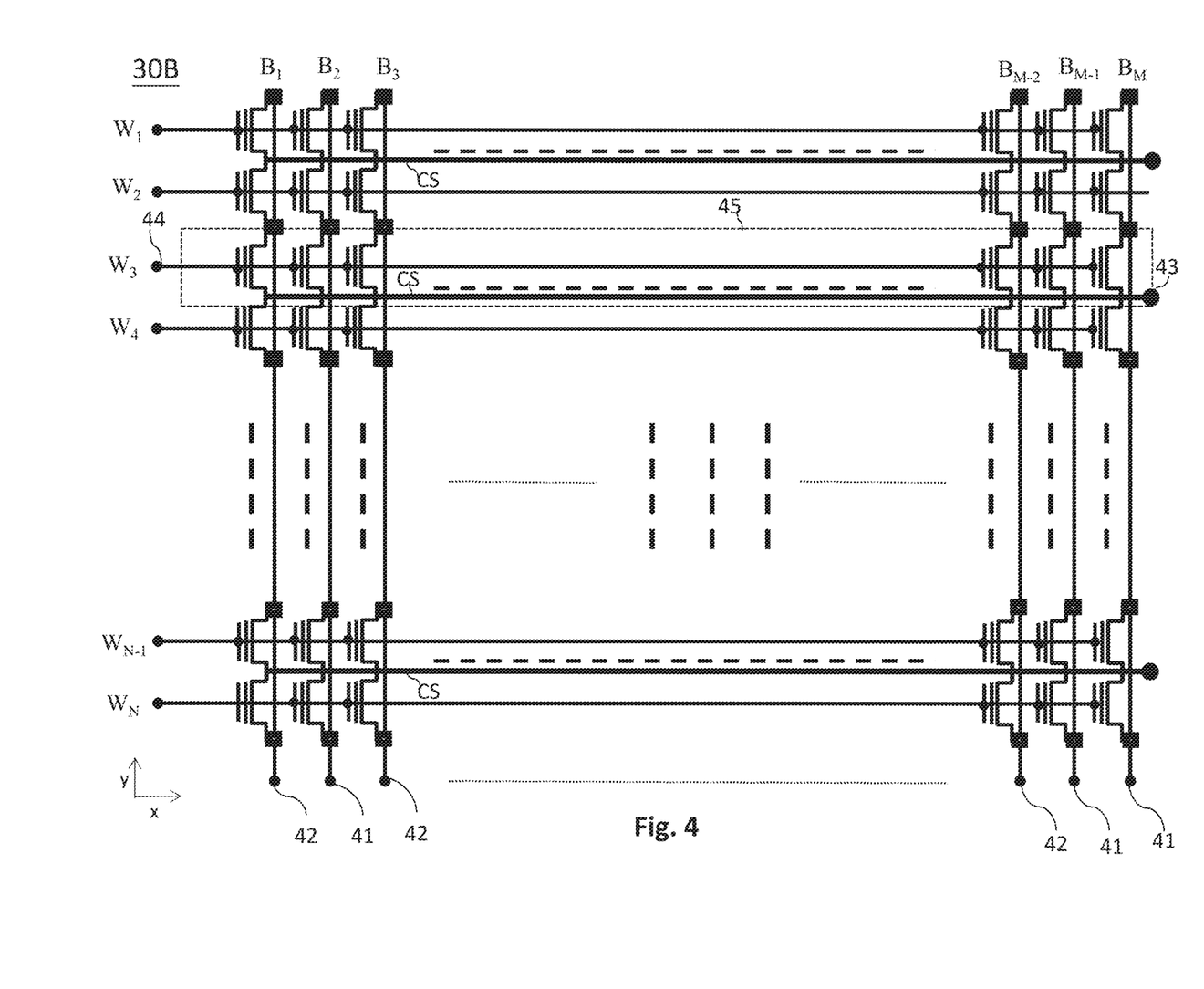
FIG. 4 shows ChiTel programming scheme is applied to the SSC NOR flash array 30B according to the invention.

For applying the ChiTel programming scheme by the controller 30A, the schematic of SSC NOR flash memory array 30B is illustrated in FIG. 4. Programming a selected row 45 of memory cells is described as follows. Firstly, the controller 30A disconnects a selected common source line CS 43 from the ground voltage to float the source nodes for the selected row 45 of memory cells under the selected wordline 44. Secondly, the controller 30A applies a voltage bias between 2V to 4V to the attached bitlines 42 for the selected memory cells to be programmed to a high threshold voltage state and no voltage bias to the attached bitlines 41 (i.e., floating the attached bitlines 41) for the non-programming memory cells to remain at the low threshold voltage state. Thirdly, the controller 30A applies a high voltage bias between 2V to 10V to the selected wordline 44 for a pulse duration of hundreds of nanoseconds to tens of microseconds. After the high voltage pulse is applied to the selected wordline 44, the programming sequence has completed to program the selected memory cells with the applied voltage bitlines 42 to a high threshold voltage state and the non-programming NVM devices with no voltage bias bitlines 41 to remain at low threshold voltage state. Usually, the states of high threshold voltage and low threshold voltages of the NVM devices represent the binary data "0" storage and "1" storage, respectively for the non-volatile data writing.

BRIEF DESCRIPTION OF THE DRAWINGS

The present invention will become more fully understood from the detailed description given herein below and the accompanying drawings which are given by way of illustration only, and thus are not limitative of the present invention, and wherein:

FIG. 3b shows the top view of a portion of SSC NOR flash cell array 30B with the minimum feature size F provided by a process technology node below 100 nm according to FIG. 3a.

DETAILED DESCRIPTION OF THE INVENTION

The following detailed description is meant to be illustrative only and not limiting. It is to be understood that other embodiment may be utilized and element changes may be made without departing from the scope of the present invention. Also, it is to be understood that the various NVM devices based on MOSFET structures with its charge storing material made of conducting floating gate, charge trap dielectrics (O/N/O, $HfO_2$, . . . etc), or nano-crystals (Si, Ge, . . . , etc), and their fabrication process used herein are for the purpose of description and should not be regarded as limiting. Those of ordinary skill in the art will immediately realize that the embodiment of the present invention described herein in the context of methods and schematics are illustrative only and are not intended to be in any way limiting. Other embodiment of the present invention will readily suggest themselves to such skilled persons having the benefits of this disclosure.

Figure 5:
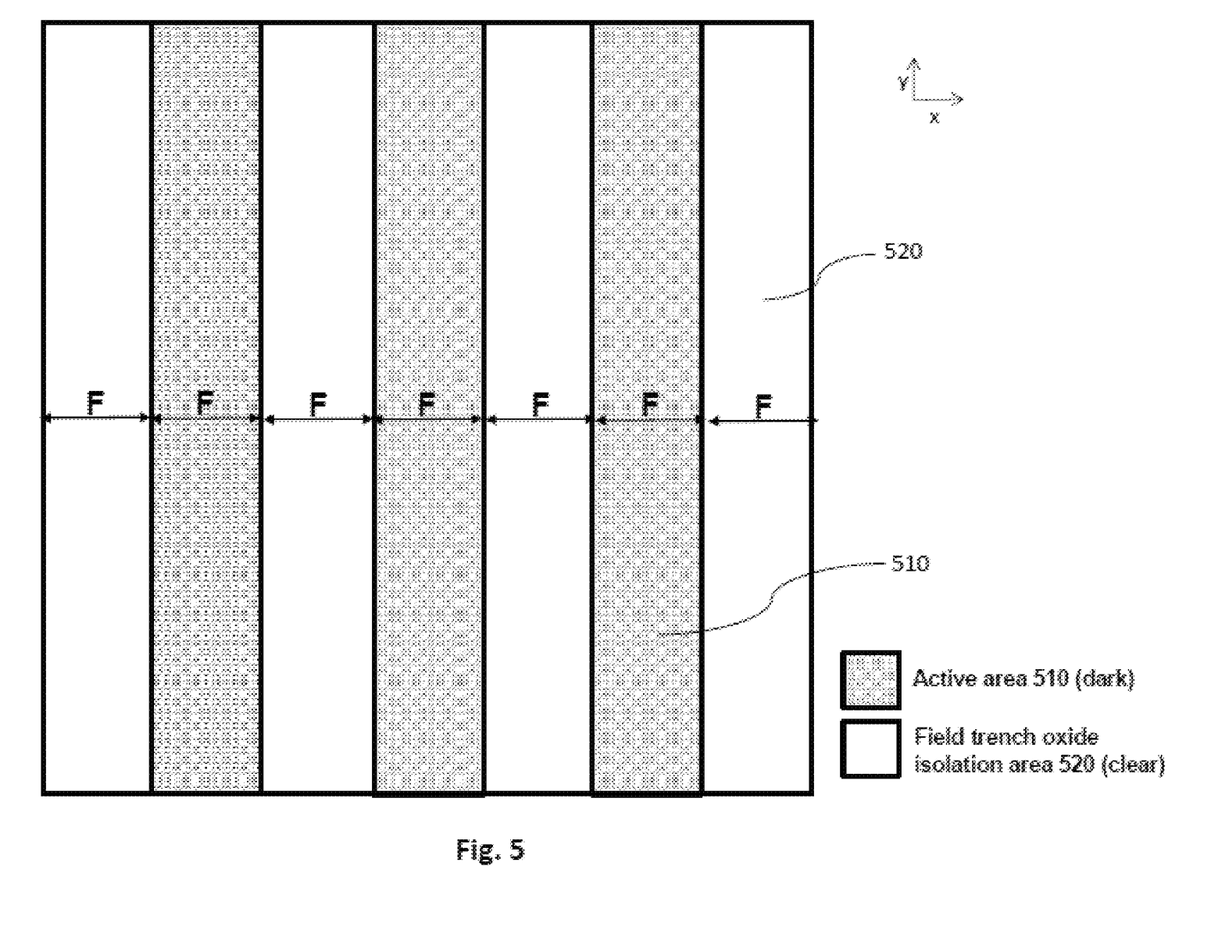
FIG. 5 shows a field isolation mask pattern in the SSC NOR flash array according to the invention.
Figure 6:
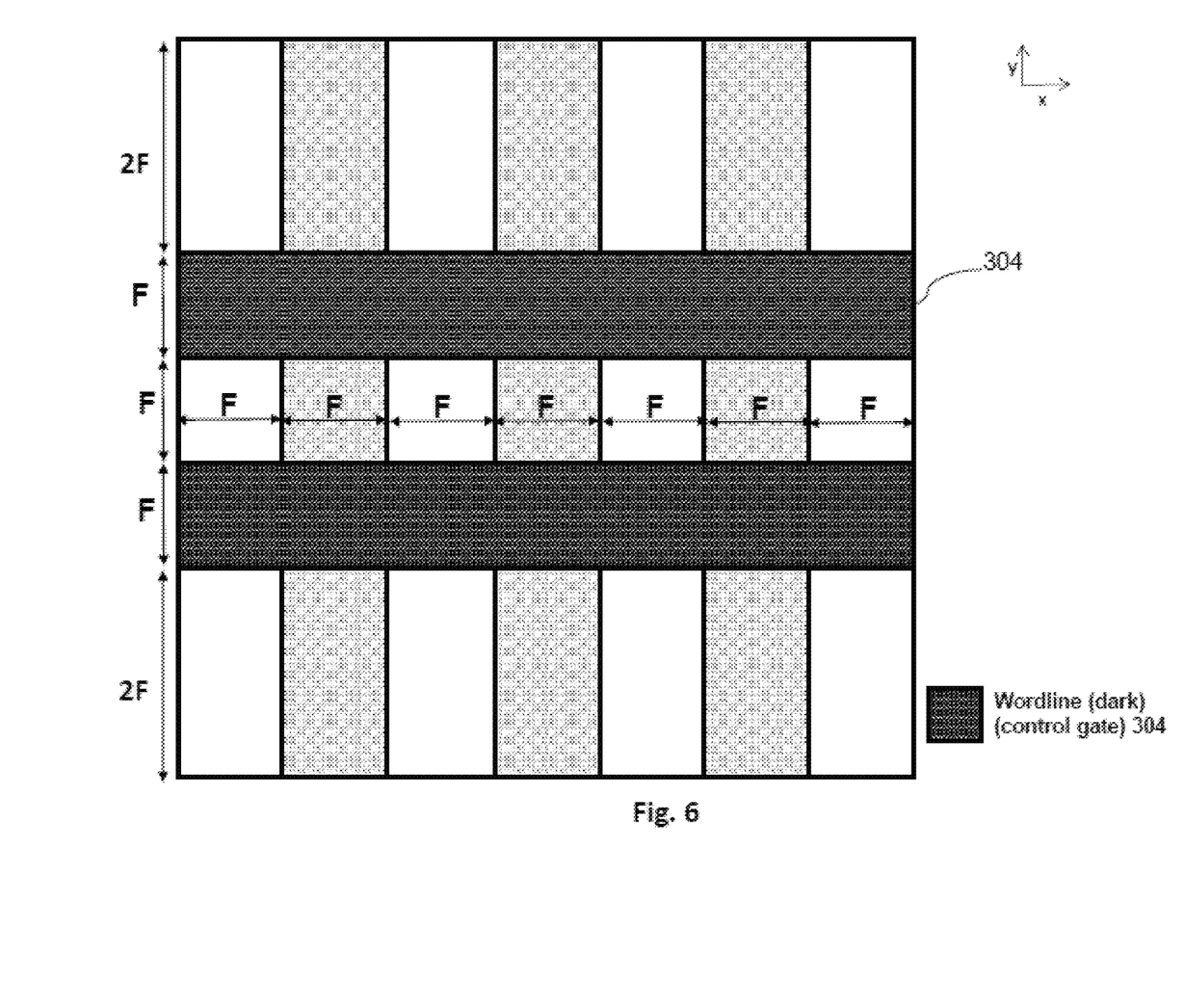
FIG. 6 shows a wordline mask pattern overlapped with the field isolation mask pattern in the SSC flash array according to the invention.
Figure 7:
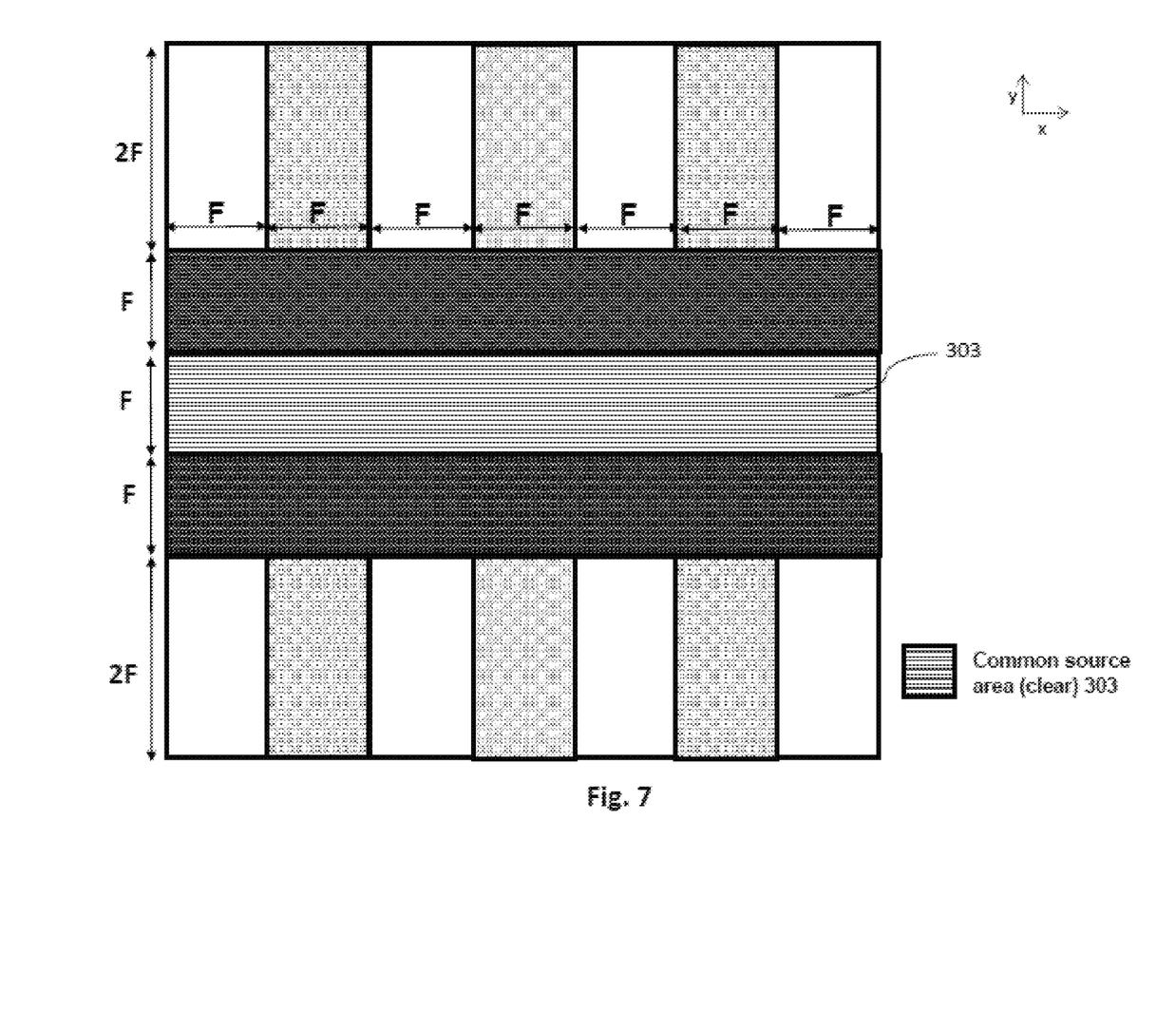
FIG. 7 shows a common source mask pattern overlapped with the field isolation mask pattern and the wordline mask pattern according to the invention.
Figure 8:
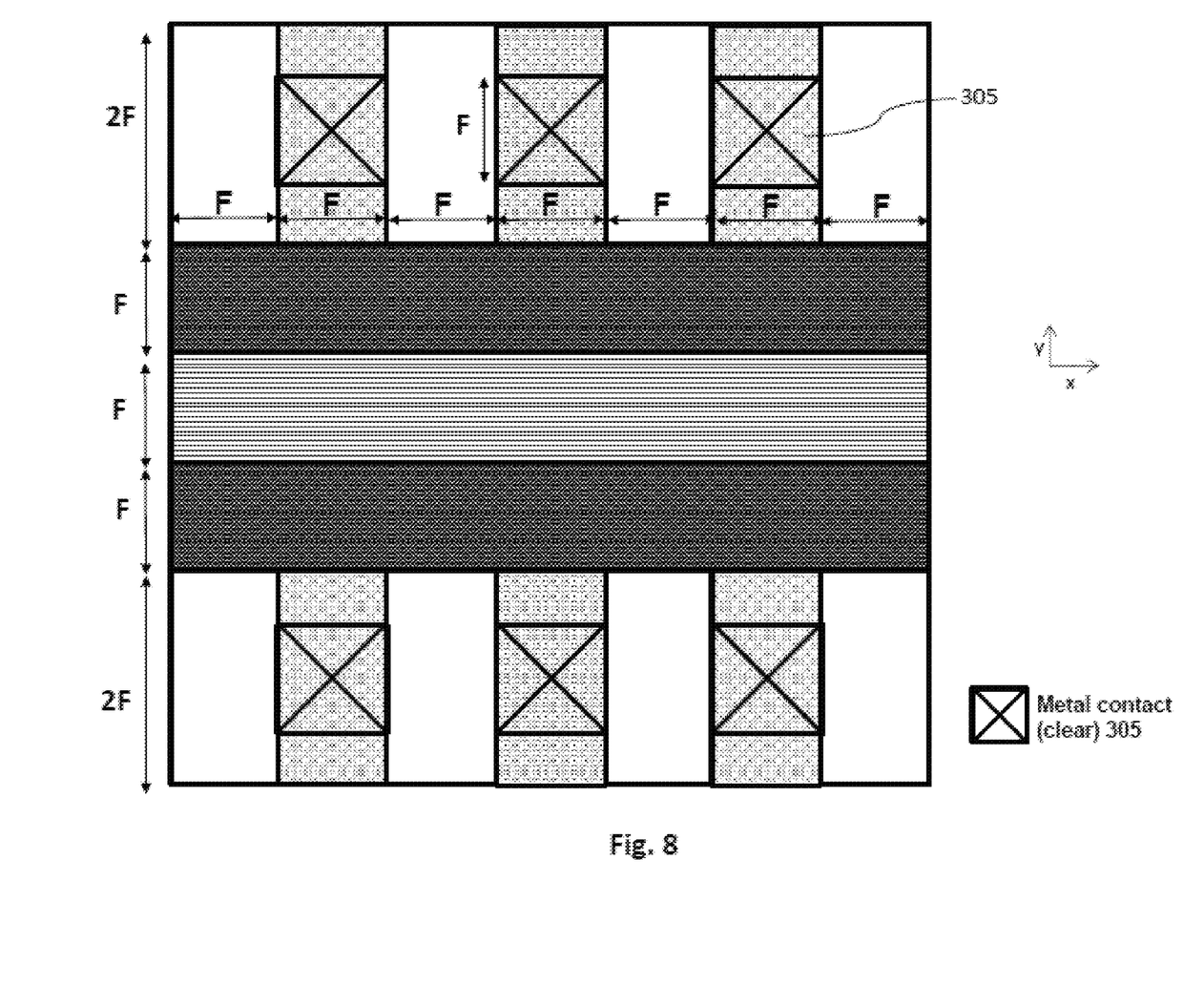
FIG. 8 shows a contact mask pattern overlapped with the field isolation mask pattern, the wordline mask pattern, and the common source mask pattern in the SSC flash array according to the invention.
Figure 9:
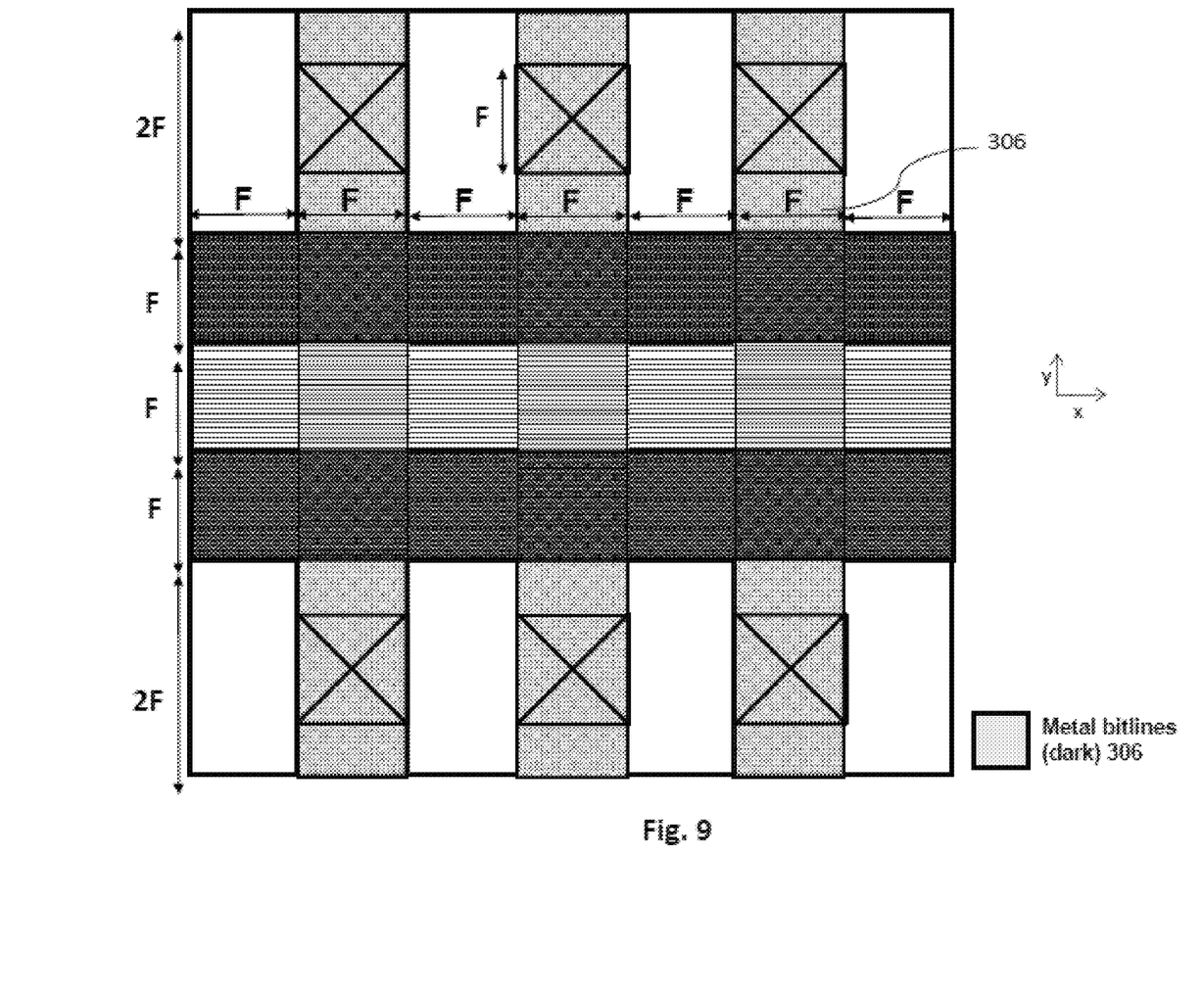
FIG. 9 shows a metal bitline mask pattern overlapped with the field isolation mask pattern, the wordline mask pattern, the common source pattern, the contact mask pattern in the SSC flash array according to the invention.

In one embodiment for the illustration purpose, we shall apply N-type floating-gate NVM cells to demonstrate the fabrication of SSC NOR flash arrays 30B. However, the SSC NOR flash array 30B are not limited to N-type floating-gate NVM cells. The fabrication of SSC NOR flash memory array 30B is the followings: (1) Ion implants are implanted into P-type silicon substrate 390 to form P-type well for cell device threshold voltage, anti-punch-through, and field, and the bottom deep N-type well isolation. (2) Tunneling oxide is grown on silicon substrate 390 to form tunneling oxides layer 318 in FIG. 3c. (3) a layer of first poly-silicon film is deposited on top of tunneling oxide 318 to form floating gates 313 in FIG. 3c. (4) A self-aligned floating-gate Shallow Trench Isolation (STI) process module using a dark-tone field isolation mask pattern for the array with the minimum blocking width F and minimum spacing width F shown in FIG. 5 is applied to form the active areas 510 and field trench oxide areas 520 in the NOR flash array. (5) An oxide film is grown on the surface of first poly-silicon and a nitride film are then deposited onto the poly floating gates 313 to form the coupling dielectrics 317 in FIG. 3c. (6) After forming the gate oxides 317 for the peripheral MOSFET devices, a layer of the second poly-silicon film is deposited and etched to form the wordlines 304 (or the control gates 314) using a dark-tone wordline mask pattern overlapped with the field isolation mask in the array shown in FIG. 6. (7) An etch process and an implant process with a clear-tone common source mask pattern overlapped with the field isolation mask and the wordline mask shown in FIG. 7 is applied to form the conducting common source lines 303 to link the source electrodes 310 of the NOR flash cell devices. (8) Spacer module is applied to encapsulate the wordlines 304 (or the control gates 314) for electrical isolation from the contacts 305 in latter process. (9) A high dosage of N-type impurity implant is performed to form the N+ drain electrodes 311 in FIG. 3c. (10) A contact module using a clear-tone contact mask pattern overlapped with the field isolation mask, the wordline mask, and the common source mask shown in FIG. 8 is applied to form metal contacts 305 in FIG. 3b. (11) A metal bitline module using a dark-tone metal bitline mask overlapped with the field isolation mask, the wordline mask, the common source mask, and the contact mask shown in FIG. 9 is applied to form the metal bitlines 306 in FIG. 3b.

The aforementioned description of the preferred embodiment of the invention has been presented for purposes of illustration and description. It is not intended to be exhaustive or to limit the invention to the precise form or to exemplary embodiment disclosed. Accordingly, the description should be regarded as illustrative rather than restrictive. The embodiment is chosen and described in order to best explain the principles of the invention and its best mode practical application, thereby to enable persons skilled in the art to understand the invention for various embodiment and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiment of the invention. It should be appreciated that variations may be made in the embodiment described by persons skilled in the

What is claimed is:

1. A NOR flash memory device comprising:
a NOR flash memory array comprising:
multiple cells organized in rows and columns on a substrate, each cell comprising a charge storing material, a control gate, a source region and a drain region, the control gate being disposed above the charge storing material for each cell, the cells in one column of the columns on the substrate being arranged in cell pairs such that each cell pair shares a common source region;
a plurality of word lines, each connecting the control gates of the cells in a corresponding row of the rows on the substrate and running in a row direction;
a plurality of common source lines, each connecting the common source regions of the cell pairs in one row and running in the row direction; and
a plurality of bit lines running in a column direction and being disposed above the plurality of word lines, each connecting the drain regions of the cells in a corresponding column of the columns on the substrate through metal contacts; and
a controller coupled to the NOR flash memory array and configured to perform a set of operations comprising:
floating a selected common source line;
applying a drain voltage to one or more selected bit lines corresponding to one or more selected cells; and
applying a voltage pulse to a selected word line of the plurality of word lines corresponding to the one or more selected cells for a predefined time interval so as to program the one or more selected cells from a first threshold voltage state to a second threshold voltage state;
wherein a first minimum distance between two column-adjacent cells, a minimum gate length and minimum widths of the common source lines, the bit lines and the metal contacts are equal to a minimum feature size F of a process technology node below 100 nm; and
wherein a second minimum distance between the metal contacts and the plurality of word lines is for electrical isolation and depends on capability of a spacer module for encapsulating the plurality of word lines.

2. The device according to claim 1, wherein the second minimum distance is F/2.

3. The device according to claim 1, wherein a minimum cell size of the cells ranges from $4F^2$ to $5F^2$.

4. The device according to claim 1, wherein the set of operations further comprises:
floating one or more unselected bit lines corresponding to one or more unselected cells prior to the operation of applying the voltage pulse;
wherein after the operation of applying the voltage pulse is completed, the one or more unselected cells remain at the first threshold voltage state.

5. The device according to claim 1, wherein the charge storing material is made of one selected from the group consisting of conducting floating gate, charge trap dielectrics and nano-crystals.

6. The device according to claim 1, wherein the predefined time interval ranges from hundreds of nanoseconds to tens of microseconds.

7. The device according to claim 1, wherein the NOR flash memory array further comprises:
a plurality of field isolations running in the column direction and defining multiple active areas that define the source regions and the drain regions of the cells, wherein a minimum width of the field isolations is equal to F.

8. A method for programming a NOR flash memory array comprising multiple cells organized in rows and columns on a substrate, multiple word lines, multiple common source lines and multiple bit lines, each cell comprising a charge storing material, a control gate, a source region and a drain region, the control gate being disposed above the charge storing material for each cell, the cells in one column of the columns on the substrate being arranged in cell pairs such that each cell pair shares a common source region, each common source line connecting the common source regions of the cell pairs in one row, each word line connecting the control gates of the cells in a corresponding row of the rows on the substrate, each bit line connecting the drain regions of the cells in a corresponding column of the columns on the substrate through metal contacts, the method comprising the steps of:
floating a selected common source line;
applying a drain voltage to one or more selected bit lines corresponding to one or more selected cells; and
applying a voltage pulse to a selected word line of the multiple word lines corresponding to the one or more selected cells for a predefined time interval so as to program the one or more selected cells from a first threshold voltage state to a second threshold voltage state;
wherein a first minimum distance between two column-adjacent cells, a minimum gate length and minimum widths of the common source lines, the bit lines and the metal contacts are equal to a minimum feature size F of a process technology node below 100 nm; and
wherein a second minimum distance between the metal contacts and the multiple word lines is for electrical isolation and depends on capability of a spacer module for encapsulating the multiple word lines.

9. The method according to claim 8, wherein the second minimum distance is F/2.

10. The method according to claim 8, wherein a minimum cell size of the cells ranges from $4F^2$ to $5F^2$.

11. The method according to claim 8, further comprising:
prior to the step of applying the voltage pulse, floating one or more unselected bit lines corresponding to one or more unselected cells;
wherein after the step of applying the voltage pulse is completed, the one or more unselected cells remain at the first threshold voltage state.

12. The method according to claim 8, wherein the charge storing material is made of one selected from the group consisting of conducting floating gate, charge trap dielectrics and nano-crystals.

13. The method according to claim 8, wherein the predefined time interval ranges from hundreds of nanoseconds to tens of microseconds.

* * * * *